United States Patent
Huh et al.

(10) Patent No.: US 9,960,073 B2
(45) Date of Patent: May 1, 2018

(54) SUBSTRATE PROCESSING APPARATUS AND SUBSTRATE PROCESSING METHOD

(71) Applicants: Song Whe Huh, Seongnam-si (KR); Jeung Hoon Han, Gwangju-si (KR)

(72) Inventors: Song Whe Huh, Seongnam-si (KR); Jeung Hoon Han, Gwangju-si (KR)

(73) Assignee: Jusung Engineering Co., Ltd., Gwangju-si (KR)

(*) Notice: Subject to any disclaimer, the term of this patent is extended or adjusted under 35 U.S.C. 154(b) by 0 days. days.

(21) Appl. No.: 15/180,935

(22) Filed: Jun. 13, 2016

(65) Prior Publication Data

US 2016/0293387 A1    Oct. 6, 2016

Related U.S. Application Data

(63) Continuation of application No. 14/366,231, filed as application No. PCT/KR2012/011228 on Dec. 21, 2012, now Pat. No. 9,387,510.

(30) Foreign Application Priority Data

Dec. 23, 2011  (KR) .................. 10-2011-0141796

(51) Int. Cl.
*H01J 37/32*  (2006.01)
*H01L 21/687*  (2006.01)
*C23C 16/509*  (2006.01)

(52) U.S. Cl.
CPC ...... *H01L 21/68764* (2013.01); *C23C 16/509* (2013.01); *H01J 37/3244* (2013.01);
(Continued)

(58) Field of Classification Search
None
See application file for complete search history.

(56) References Cited

U.S. PATENT DOCUMENTS 8,069,817 B2  12/2011  Fischer et al.
2002/0007793 A1*  1/2002  Sakai ............... C23C 16/24
                                                    118/723 E
(Continued)

FOREIGN PATENT DOCUMENTS

CN  101003033 A  7/2007
CN  102239543 A  11/2011
(Continued)

OTHER PUBLICATIONS

Sung Hyun Park et al.; "Apparatus for Atomic Layer Deposition"; May 17, 2011; Abstract of KR20110051043 (A); www.worldwide.espacenet.com.
(Continued)

*Primary Examiner* — Joseph A Miller, Jr.
(74) *Attorney, Agent, or Firm* — Andrew D. Fortney; Central California IP Group, P.C.

(57) ABSTRACT

Disclosed is a substrate processing apparatus and method which facilitate to improve uniformity of thin film material and also facilitate to control quality of thin film by the use of plasma forming space and source gas distributing space separately provided from each other, wherein the substrate processing apparatus includes a process chamber; a substrate support for supporting a plurality of substrates, the substrate support rotatably provided inside the process chamber; and an electrode unit arranged above the substrate support and provided with the plasma forming space and the source gas distributing space, wherein the plasma forming space is spatially separated from the source gas distributing space.

16 Claims, 7 Drawing Sheets

(52) U.S. Cl.
CPC .... *H01J 37/3255* (2013.01); *H01J 37/32568* (2013.01); *H01J 37/32715* (2013.01); *H01J 37/32752* (2013.01); *H01L 21/68771* (2013.01)

(56) References Cited

U.S. PATENT DOCUMENTS

| | | | |
|---|---|---|---|
| 2003/0129107 A1* | 7/2003 | Denes | B29C 59/14 422/186.21 |
| 2007/0163440 A1 | 7/2007 | Kim et al. | |
| 2008/0242085 A1 | 10/2008 | Fischer et al. | |
| 2009/0078204 A1 | 3/2009 | Kerr et al. | |
| 2011/0005681 A1* | 1/2011 | Savas | C23C 16/24 156/345.33 |
| 2011/0048325 A1* | 3/2011 | Choi | C23C 16/452 118/712 |
| 2011/0083602 A1 | 4/2011 | Bergmann et al. | |
| 2012/0247390 A1* | 10/2012 | Sawada | C23C 16/4412 118/723 AN |
| 2013/0309416 A1* | 11/2013 | Yokoyama | C23C 16/4412 427/569 |

FOREIGN PATENT DOCUMENTS

| | | |
|---|---|---|
| KR | 100646017 B1 | 11/2006 |
| KR | 100682077 B1 | 2/2007 |
| KR | 20080028540 A | 4/2008 |
| KR | 100874341 B1 | 12/2008 |
| KR | 10-2010-0025699 A | 3/2010 |
| KR | 1020110051043 A | 5/2011 |
| KR | 1020110080458 A | 7/2011 |

OTHER PUBLICATIONS

Sang Jin Lee, et al.; "Apparatus Depositing Thin Film and Method of Depositing Thin Film Using Ozone Plasma"; Jul. 13, 2011; Abstract of KR20110080458 (A); www.worldwide.espacenet.com.

Myung Eun Sung et al.; "Apparatus for Generating Plasma"; Dec. 16, 2008; Abstract of KR100874341 (B1); www.worldwide. espacenet.com.

In Chel Shin et al.; "Surface Processing Apparatus Using Neutral Beam and Method at the Same"; Feb. 6, 2007; Abstract of KR100682077 (B1); www.worldwide.espacenet.com.

Kyung Soo Kim et al.; "A Showerhead Using Multi-Hollows Cathode of a Type of Gas Separation"; Nov. 7, 2006; Abstract of KR100646017 (B1); www.worldwide.espacenet.com.

Office Action dated Dec. 7, 2017 for Korean Patent Application No. 10-2013-0134833; 6 pgs.; Korean Intellectual Property Office, Republic of Korea.

Wi Soon Im; "Capacitively Coupled Plasma Reactor and Plasma Processing Method Using the Same and Semiconductor Device Manufactured Thereby"; Bibliographic Data of KR20100025699 (A); Mar. 10, 2010; http://worldwide.espacenet.com.

Office Action dated Jan. 24, 2018 for Chinese Patent Application No. 201610685905.6; 5 pgs; The State Intellectual Property Office of the P.R.D., People's Republic of China.

Kim Kyung S Bae Guen H Kim Ho et al; "Gas Separation Type Showerhead"; Bibliographic Data of CN101003033 (A); Jul. 25, 2007; http://ww.espacenet.com.

Ki Taek Jung; "Apparatus for Vapor Deposition of Organic and Method for Deposition Using the Same"; Bibliographic Data of KR20080028540 (A); Apr. 21, 2008; http://ww.espacenet.com.

Choi Sun Hong et al; "Gas Distribution Apparatus, and Substrate-Processing Apparatus Comprising Same"; Bibliographic Data of CN102239543 (A); Nov. 9, 2011; http://ww.espacenet.com.

\* cited by examiner

SUBSTRATE PROCESSING APPARATUS AND SUBSTRATE PROCESSING METHOD

CROSS REFERENCE TO RELATED APPLICATIONS

This application is a continuation of U.S. patent application Ser. No. 14/366,231, filed Jun. 17, 2014, pending, incorporated herein by reference in its entirety, which is a national phase application of International Application No. PCT/KR2012/011228, filed on Dec. 21, 2012, which in turn claims the benefit of the Korean Patent Application No. 10-2011-0141796 filed on Dec. 23, 2011, which is hereby incorporated by reference as if fully set forth herein.

BACKGROUND

Field of the Disclosure

The present invention relates to a substrate processing apparatus, and more particularly, to a substrate processing apparatus and method which facilitate to improve uniformity of thin film material and also facilitate to control quality of thin film by the use of plasma space and source gas distributing space separately provided from each other.

Discussion of the Related Art

Generally, in order to manufacture a solar cell, a semiconductor device and a flat panel display device, it is necessary to form a predetermined thin film layer, a thin film circuit pattern or an optical pattern on a surface of substrate. To this end, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film. The semiconductor manufacturing process is performed inside a substrate processing apparatus designed to be suitable for optimal circumstances. Recently, a substrate processing apparatus using plasma is generally used to carry out a deposition or etching process.

This substrate processing apparatus using plasma may be a PECVD (Plasma Enhanced Chemical Vapor Deposition) apparatus for forming a thin film, and a plasma etching apparatus for etching and patterning the thin film.

FIG. 1 illustrates a substrate processing apparatus according to the related art.

Referring to FIG. 1, the substrate processing apparatus according to the related art may include a chamber 10, a plasma electrode 20, a susceptor 30, and a gas distributing means 40.

The chamber 10 provides a reaction space for substrate processing. In this case, a predetermined portion of a bottom surface of the chamber 10 is communicated with an exhaust port 12 for discharging gas from the reaction space.

The plasma electrode 20 is provided over the chamber 10 so as to seal the reaction space.

One side of the plasma electrode 20 is electrically connected with a RF (Radio Frequency) power source 24 through a matching member 22. The RF power source 24 generates RF power of 40 MHz, and supplies the generated RF power to the plasma electrode 20. Also, a central portion of the plasma electrode 20 is communicated with a gas supply pipe 26 supplying source gas for the substrate processing. The matching member 22 is connected between the plasma electrode 20 and the RF power source 24, to thereby match load impedance and source impedance of the RF power supplied from the RF power source 24 to the plasma electrode 20.

The susceptor 30 is provided inside the chamber 10, and the susceptor 30 supports a plurality of substrates (W) loaded from the external. The susceptor 30 corresponds to an opposite electrode in opposite to the plasma electrode 20, and the susceptor 30 is electrically grounded by an elevating axis 32 for elevating the susceptor 30.

The elevating axis 32 moves upward or downward by an elevating apparatus (not shown). In this case, the elevating axis 32 is surrounded by a bellows 34 for sealing the bottom surface of the chamber 10, whereby the elevating axis 32 together with the bellow 34 seals the bottom surface of the chamber 10.

The gas distributing means 40 is provided below the plasma electrode 20, wherein the gas distributing means 40 confronts the susceptor 30. In this case, a gas diffusion space 42 is formed between the gas distributing means 40 and the plasma electrode 20, wherein source gas supplied from the gas supply pipe 26 penetrating through the plasma electrode 20 is diffused in the gas diffusion space 42. The gas distributing means 40 uniformly distributes the source gas to the entire area of the reaction space through a plurality of gas distributing holes 44 being communicated with the gas diffusion space 42.

In case of the substrate processing apparatus according to the related art, after the substrate (W) is loaded onto the susceptor 30, the predetermined source gas is distributed to the reaction space of the chamber 10, and an electromagnetic field is formed in the reaction space by the RF power supplied to the plasma electrode 20, whereby plasma is formed on the substrate (W) by the electromagnetic field, thereby forming the predetermined thin film on the substrate (W).

However, in case of the substrate processing apparatus according to the related art, the space for distributing the source gas is the same as the space for forming the plasma. Thus, uniformity in the thin film material deposited on the substrate (W) depends on plasma density uniformity formed in the reaction space, which might cause difficulty in controlling quality of the thin film formed on the substrate (W).

SUMMARY

Accordingly, embodiments of the present invention are directed to a substrate processing apparatus and method that substantially obviate one or more problems due to limitations and disadvantages of the related art.

An aspect of embodiments of the present invention is directed to provide a substrate processing apparatus and method which facilitate to improve uniformity of thin film material and also facilitate to control quality of thin film by the use of plasma space and source gas distributing space separately provided from each other.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a substrate processing apparatus that may include a process chamber; a substrate support for supporting a plurality of substrates, the substrate support rotatably provided inside the process chamber; and an electrode unit arranged above the substrate support and provided with a plasma forming space for forming plasma to the substrate and a source gas distributing space for distributing source gas onto the substrate, wherein the plasma forming space is spatially separated from the source gas distributing space.

There are the plurality of plasma forming spaces and the plurality of source gas distributing spaces, wherein each source gas distributing space is formed between each of the plasma forming spaces so as to spatially separate the plurality of plasma forming spaces from one another.

Also, the electrode unit further includes a plurality of purge gas distributing spaces for distributing purge gas onto the substrate, wherein each of the purge gas distributing spaces is prepared in between a pair of plasma forming spaces prepared in between a pair of neighboring source gas distributing spaces, or prepared between the plasma forming space and the source gas distributing space while being spatially separated.

In another aspect of an embodiment of the present invention, there is provided a substrate processing method that may include (A) placing a plurality of substrates onto a substrate support rotatably provided in a process chamber; (B) rotating the substrate support onto which the plurality of substrates are placed; (C) supplying source gas to a source gas distributing space, which is formed in an electrode unit being electrically grounded and is spatially separated from a plasma forming space prepared in the electrode unit, and distributing the source gas onto the substrate; and (D) forming plasma in the plasma forming space and forming the plasma toward the substrate.

The above step (D) may include supplying reaction gas to the plasma forming space; and supplying plasma power to the plasma forming space.

Also, the above step (D) may further include supplying purge gas to the plasma forming space.

In addition, the substrate processing method may further include a step (E) for supplying purge gas to the purge gas distributing space prepared in the electrode unit so as to spatially separate the plasma forming space and the source gas distributing space from each other, and distributing the purge gas onto the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

Hereinafter, a substrate processing apparatus according to the embodiment of the present invention will be described with reference to the accompanying drawings.

Figure 1:
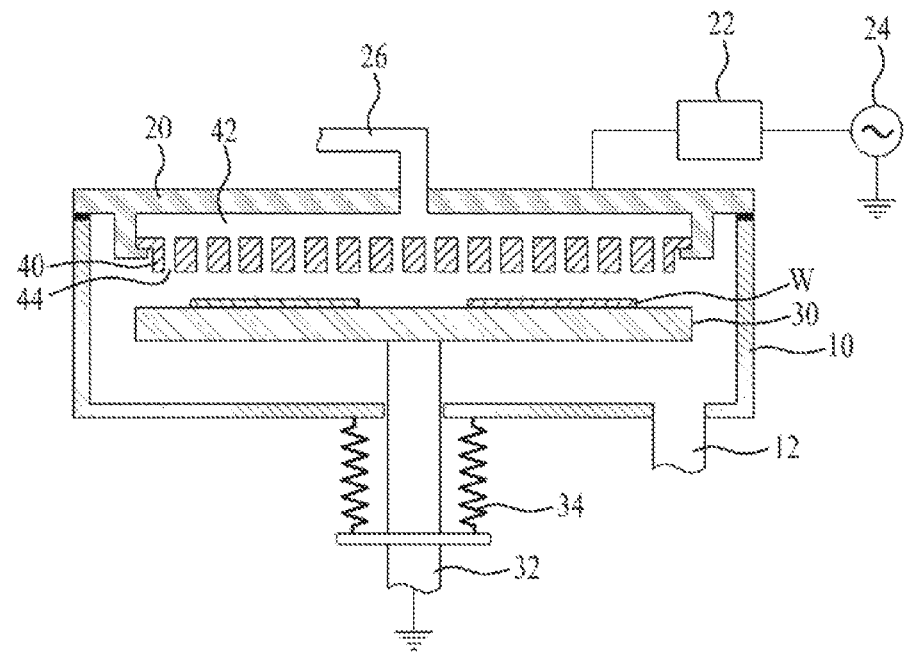
FIG. 1 illustrates a substrate processing apparatus according to the related art.
Figure 2:
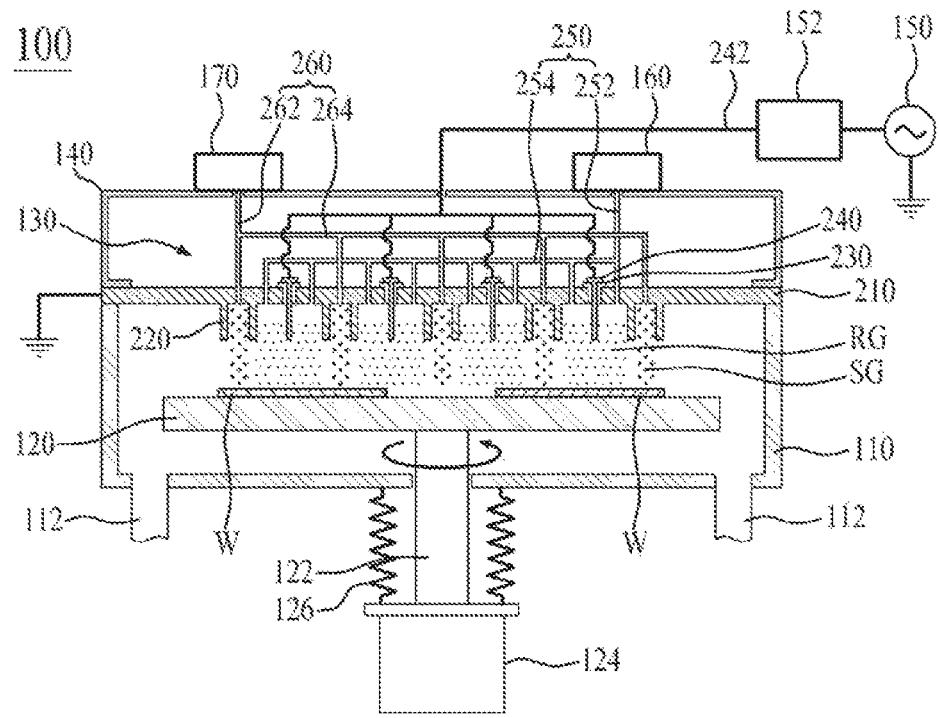
FIG. 2 illustrates a substrate processing apparatus according to the first embodiment of the present invention.
Figure 3:
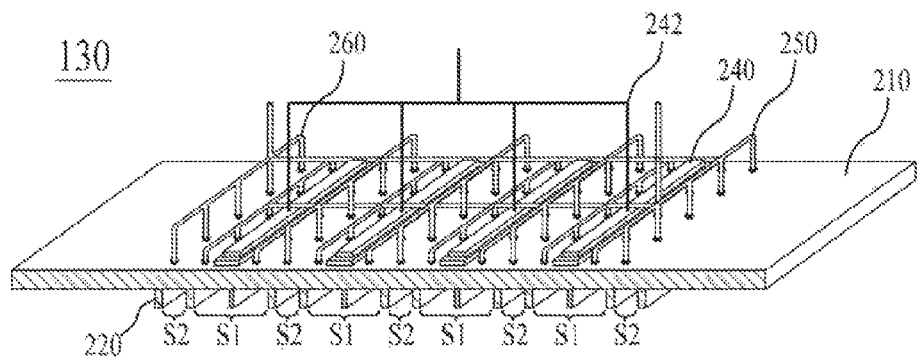
FIG. 3 is a perspective view showing an electrode unit of FIG. 2.
Figure 4:
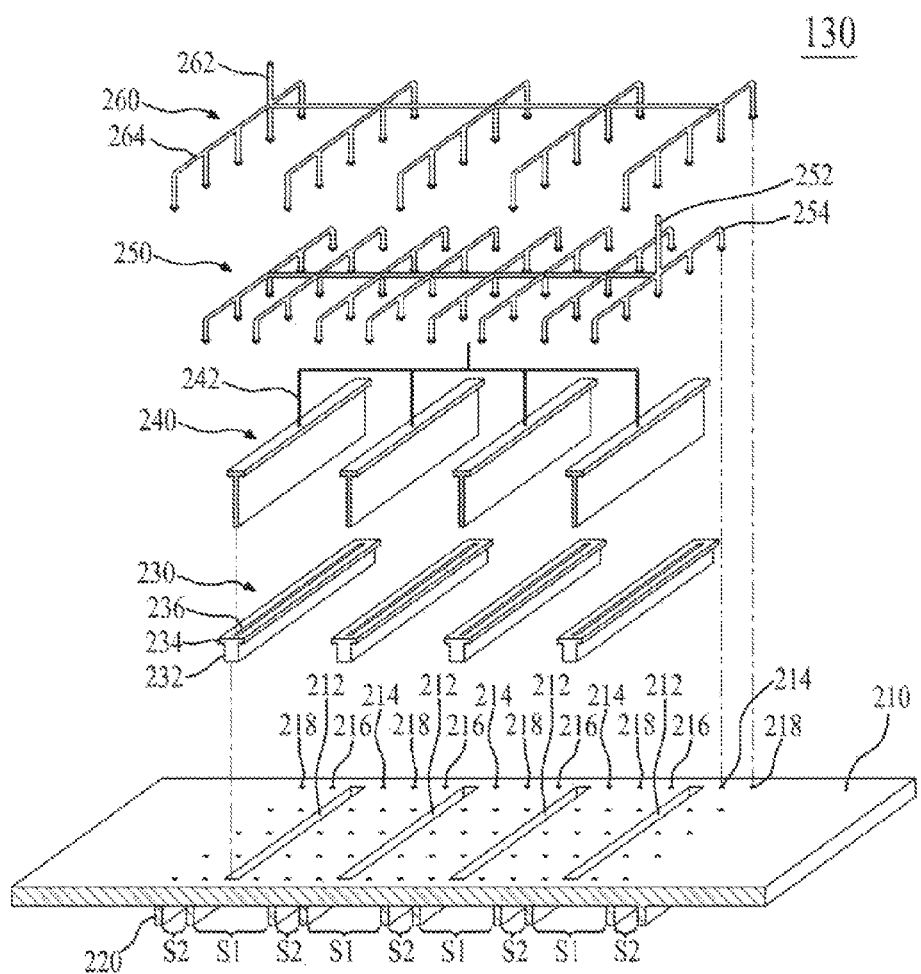
FIG. 4 is an exploded perspective view showing an electrode unit of FIG. 3.

FIG. 2 illustrates a substrate processing apparatus according to the first embodiment of the present invention. FIG. 3 is a perspective view showing an electrode unit of FIG. 2. FIG. 4 is an exploded perspective view showing an electrode unit of FIG. 3.

Referring to FIGS. 2 to 4, the substrate processing apparatus according to the first embodiment of the present invention may include a process chamber 110, a substrate support 120, an electrode unit 130, an electrode cover 140, a plasma power supplier 150, a reaction gas supplier 160, and a source gas supplier 170.

The process chamber 110 provides a reaction space for substrate processing. In this case, a bottom surface of the process chamber 110 may be communicated with an exhaust port 112 for discharging gas from the reaction space.

The substrate support 120 may be rotatably provided inside the process chamber 110. The substrate support 120 may be supported by a rotating axis 122 penetrating through a central portion of the bottom surface of the process chamber 110. According as the rotating axis 122 is rotated by driving an axis driving member 124, the substrate support 120 is rotated in a predetermined direction. The rotating axis 122 exposed out of the bottom surface of the process chamber 100 to the external is covered by a bellows 126 provided in the bottom surface of the process chamber 110.

The substrate support 120 supports a plurality of substrates (W) loaded by an external substrate loading apparatus (not shown). The substrate support 120 may be formed in shape of a circular plate. The substrate (W) may be a semiconductor substrate or a wafer. Preferably, the plurality of substrates (W) may be arranged at fixed intervals in a circular pattern on the substrate support 120.

The electrode unit 130 is provided on the process chamber 110, wherein the electrode unit 130 confronts the substrate support 120. In this case, the electrode unit 130 is covered by the electrode cover 140. The electrode unit 130 is provided for forming plasma onto the substrate (W) through a plasma forming space (S1), and also distributing source gas (SG) onto the substrate (W) through a source gas distributing space (S2) spatially separated from the plasma forming space (S1). In this case, there may be the plurality of plasma forming spaces (S1), and each source gas distributing space (S2) may be formed between each of the source gas forming spaces (S1) so as to spatially separate the plurality of plasma forming spaces (S1) from each other.

In detail, as shown in FIGS. 3 and 4, the electrode unit 130 may include a ground frame 210, a plurality of space forming members 220, a plurality of insulating members 230, a plurality of plasma electrode members 240, a reaction gas supply member 250, and a source gas supply member 260.

The ground frame 210 is provided on the process chamber 110 so as to cover the process chamber 110, whereby the ground frame 210 confront the plurality of substrates (W) supported by the substrate support 120. The ground frame 210 is electrically grounded.

The ground frame 210 may include a plurality of insertion holes 212, and a plurality of first to third gas supply holes 214, 216 and 218.

Each of the insertion holes 212 overlaps with a central portion in each of the plasma forming spaces (S1). In this case, each of the insertion holes 212 is formed in a rectangular shape.

Each of the first gas supply holes 214 is overlapped with each of the plasma forming spaces (S1) while being adjacent to one side of each of the insertion holes 212. In this case, each of the first gas supply holes 214 is provided in parallel to a longitudinal direction of each of the plural insertion holes 212.

Each of the second gas supply holes 216 is overlapped with each of the plasma forming spaces (S1) while being adjacent to the other side of each of the insertion holes 212. In this case, each of the second gas supply holes 216 is provided in parallel to a longitudinal direction of each of the plural insertion holes 212.

Each of the third gas supply holes 218 is overlapped with each of the source gas distributing spaces (S2) while being adjacent to one side of each of the plural first gas supply holes 214 or the other side of each of the plural second gas supply holes 216. In this case, each of the third gas supply holes 218 is provided in parallel to each of the plural first or second gas supply holes 214 or 216.

Each of the space forming members 220 protrudes with a predetermined height from a lower surface of the ground frame 210, which overlaps with a portion between the first and second gas supply holes 214 and 216 or a portion between the second and third gas supply holes 216 and 218, toward the substrate support 120, to thereby prepare the plurality of plasma forming spaces (S1) and the plurality of source gas distributing spaces (S2) which are spatially separated from each other. In this case, each of the plural space forming members 220 is provided in parallel to a longitudinal direction of each of the plural insertion holes 212. Accordingly, each plasma forming space (S1) overlaps with each insertion hole 212 and the first and second gas supply holes 214 and 216 being adjacent to both sides of the longitudinal direction of each insertion hole 212. Each of the source gas distributing spaces (S2) is prepared between each of the plasma forming spaces (S1) while being overlapped with each of the third gas supply holes 218. The plurality of space forming members 220 are integrated with the electrically-grounded ground frame 210 so that the plurality of source gas distributing spaces (S2) make the plurality of plasma forming spaces (S1) electrically separated from one another.

Each of the insulating members 230, which is formed of an insulating material, is inserted into each of the insertion holes 212 formed in the ground frame 210. To this end, each of the insulating members 230 has a T-shaped cross section. Each of the insulating members 230 may include a body 232 inserted into the insertion hole 212 of the ground frame 210, a head 234 formed on an upper surface of the body 232 and supported by an upper surface of the ground frame 210, and an opening 236 penetrating through the head 234 and the body 232. Each of the insulating member 230 electrically insulates the ground frame 210 from the plasma electrode member 240 to be described later.

Each of the plasma electrode members 240 is formed of an electrically conducting material. Each of the plasma electrode members 240 which is inserted into the opening 236 of the insulating member 230 protrudes at a predetermined height out of the lower surface of the ground frame 210, whereby each of the plasma electrode members 240 is positioned in the plasma forming space (S1). Preferably, a protruding height for each of the plasma electrode members 240 is the same as a height for each of the space forming members 220. To this end, each of the plasma electrode members 240 has a T-shaped cross section. Each of the plasma electrode members 240 is electrically connected with the plasma power supplier 150 via a feed cable 242.

The reaction gas supply member 250 supplies reaction gas, which is supplied from the reaction gas supplier 160, to the plurality of first and second gas supply holes 214 and 216 formed in the ground frame 210, whereby the reaction gas is distributed to each of the plasma forming spaces (S1) through the plurality of first and second gas supply holes 214 and 216. To this end, the reaction gas supply member 250 may include a first main gas pipe 252, and a plurality of first branch gas pipes 254.

The first main gas pipe 252 penetrating through the electrode cover 140 is connected with the reaction gas supplier 160.

Each of the first branch gas pipes 254 is diverged from the first main gas pipe 252, and is then combined with the ground frame 210 while being communicated with the plurality of first and second gas supply holes 214 and 216 formed in the ground frame 210.

The source gas supply member 260 supplies source gas, which is supplied from the source gas supplier 170, to the plurality of third gas supply holes 218 formed in the ground frame 210, whereby the source gas is distributed to each of the source gas distributing spaces (S2) through the plurality of third gas supply holes 218. To this end, the source gas supply member 260 may include a second main gas pipe 262, and a plurality of second branch gas pipes 264.

The second main gas pipe 262 penetrating through the electrode cover 140 is connected with the source gas supplier 170.

Each of the second branch gas pipes 264 is diverged from the second main gas pipe 262, and is then combined with the ground frame 210 while being communicated with the plurality of third gas supply holes 218 formed in the ground frame 210.

The plasma power supplier 150 generates plasma power having a predetermined frequency, and then supplies the generated plasma power to each of the plasma electrode members 240 of the electrode unit 130 via the feed cable 242. In this case, the plasma power may be High Frequency (HF) power or Very High Frequency (VHF) power. For example, the HF power may have a frequency range of 3 MHz-30 MHz, and the VHF power may have a frequency range of 30 MHz-300 MHz.

The feed cable 242 is connected with an impedance matching circuit 152 for matching load impedance and source impedance of the plasma power supplied from the plasma power supplier 150 to each of the plasma electrode members 240. The impedance matching circuit 152 may include at least two of impedance element (not shown) formed of at least one selected from the group consisting of capacitor and inductor.

The reaction gas supplier 160 supplies the reaction gas to each of the plasma forming spaces (S1) of the electrode unit 130. To this end, the reaction gas supplier 160 may be provided on an upper surface of the electrode cover 140 or outside the process chamber 110, and be communicated with each of the plasma forming spaces (S1) of the electrode unit 130 through the aforementioned reaction gas supply member 250. In this case, the reaction gas may be gas which reacts with the source gas (SG). For example, the reaction gas may be at least one selected from the group consisting of nitrogen ($N_2$), oxygen ($O_2$), nitrogen dioxide ($NO_2$) or ozone ($O_3$). The reaction gas becomes a plasma state by the plasma generated in the plasma forming space (S1), and then the reaction gas of the plasma state is distributed onto the substrate (W). As the reaction gas of the plasma state distributed onto the substrate (W) reacts with the source gas (SG) distributed onto the substrate (W), a desired thin film material is deposited on the substrate (W).

The source gas supplier 170 supplies the source gas to each of the source gas distributing spaces (S2) of the electrode unit 130. To this end, the source gas supplier 170 may be provided on an upper surface of the electrode cover 140 or outside the process chamber 110, and be communicated with each of the source gas distributing spaces (S2) of the electrode unit 130 through the aforementioned source gas supply member 260. In this case, the source gas (SG) may contain a thin film material to be deposited on the substrate (W), for example, silicon (Si), titanium family element (Ti, Zr, Hf, and etc.), or aluminum (Al). For example, the source gas (SG) containing silicon (Si) may be Silane ($SiH_4$), Disilane ($Si_2H_6$), Trisilane ($Si_3H_8$), TEOS (Tetraethylorthosilicate), DCS (Dichlorosilane), HCD (Hexachlorosilane), TriDMAS (Tri-dimethylaminosilane), TSA (Trisilylamine), and etc. As the source gas (SG) reacts with the aforementioned reaction gas (RG), the desired thin film material is deposited on the substrate (W), to thereby form the thin film on the substrate (W).

Figure 5:
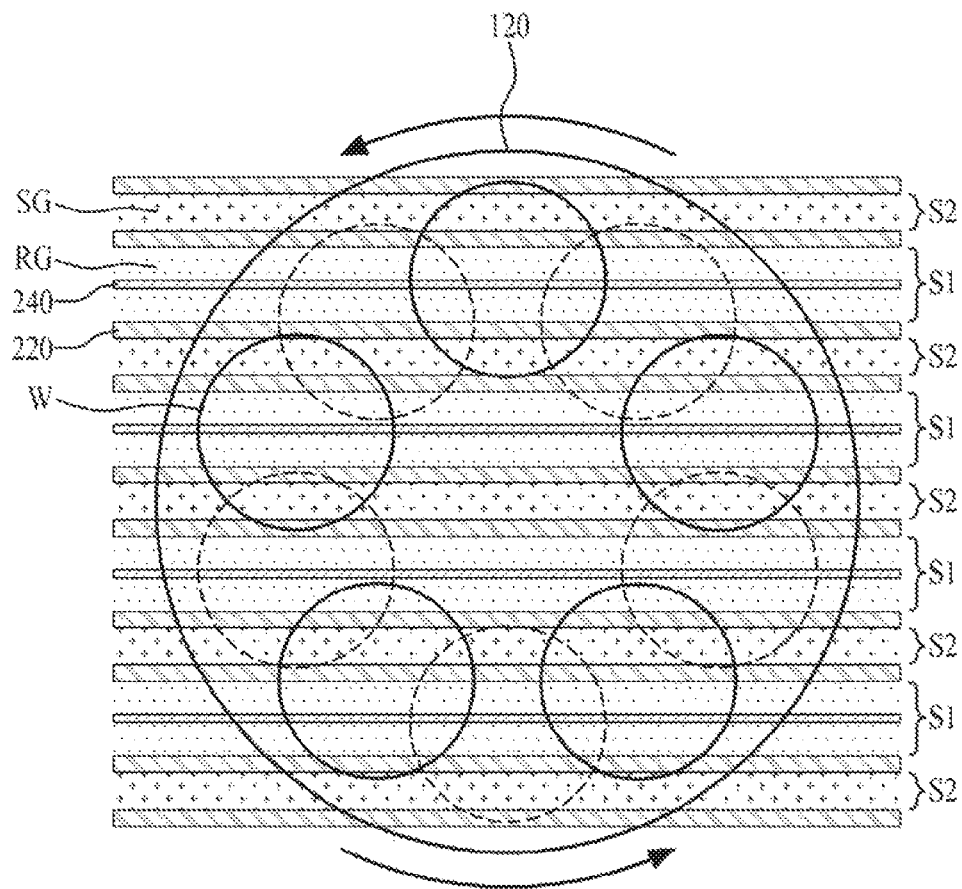
FIGS. 5 and 6 are views for explaining a substrate processing method using the substrate processing apparatus according to the first embodiment of the present invention.
Figure 6:
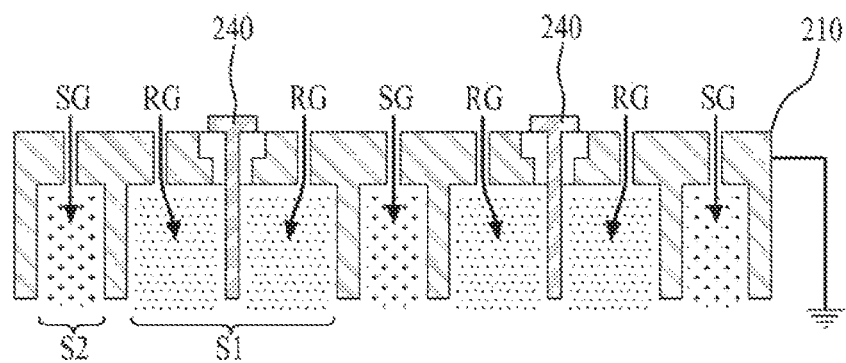

FIGS. 5 and 6 are views for explaining a substrate processing method using the substrate processing apparatus according to the first embodiment of the present invention.

Referring to FIGS. 5 and 6, the substrate processing method using the substrate processing apparatus according to the first embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 130, and is then distributed toward a lower side for each of the source gas distributing spaces (S2), whereby the source gas (SG) is distributed onto the plurality of substrates (W) rotated in accordance with the rotation of the substrate support 120.

Then, the plasma power is supplied to each of the plasma electrode members 240 prepared in the electrode unit 130, and the reaction gas (RG) is supplied to each of the plasma forming spaces (S1) so as to form the plasma for each of the plasma forming spaces (S1), whereby the reaction gas of the plasma state in the plasma forming space (S1) is formed (or jetted) toward the substrate (W). In this case, the reaction gas of the plasma state is formed to a lower side for each of the plasma forming spaces (S1) by a flux (or flow) of the reaction gas (RG) supplied to the plasma forming space (S1). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby the predetermined thin film material is deposited on the substrate (W).

In the above substrate processing apparatus and method, the steps for distributing the source gas (SG) and forming the plasma may be carried out at the same time, or may be carried out in sequence.

The above substrate processing apparatus and method according to the first embodiment of the present invention improves step coverage of the thin film material and facilitates to control quality of the thin film by spatially separating the plasma forming space (S1) and the source gas distributing space (S2) prepared in the electrode unit 130 arranged above an entire upper side of the substrate support 120 for rotating the plurality of substrates (W), and also improves use efficiency of the source gas (SG) and uniformity of the thin film material by preventing the thin film material from being deposited in the surroundings of plasma forming space (S1) and/or plasma electrode member 240 or minimizing the deposition of thin film material in the surroundings of plasma forming space (S1) and/or plasma electrode member 240.

Figure 7:
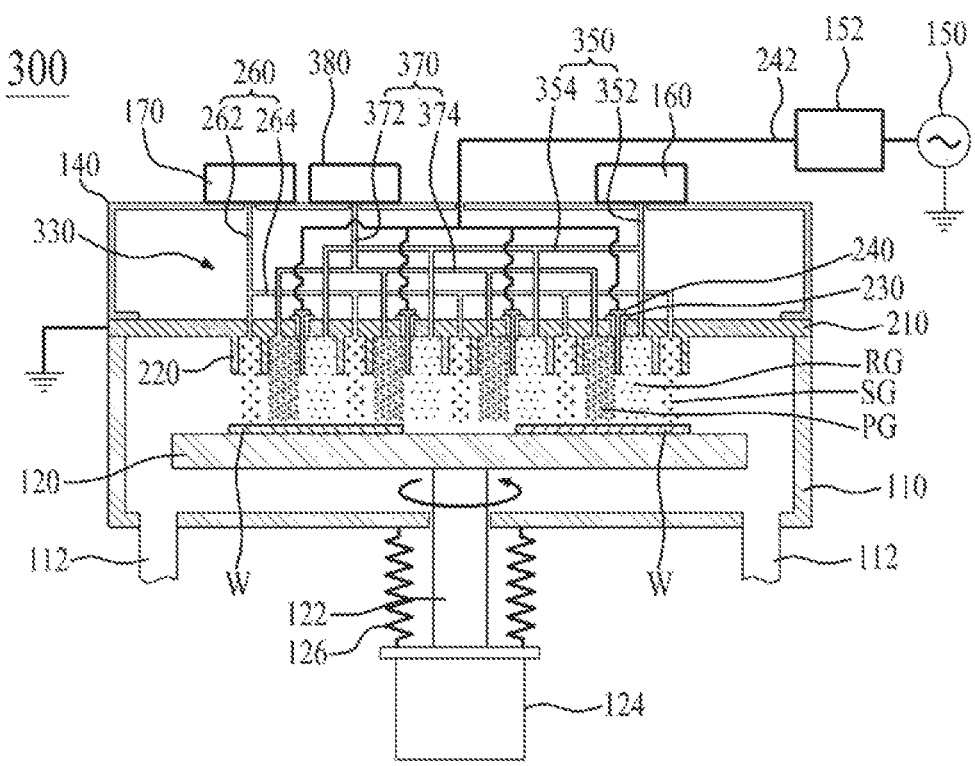
FIG. 7 illustrates a substrate processing apparatus according to the second embodiment of the present invention.
Figure 8:
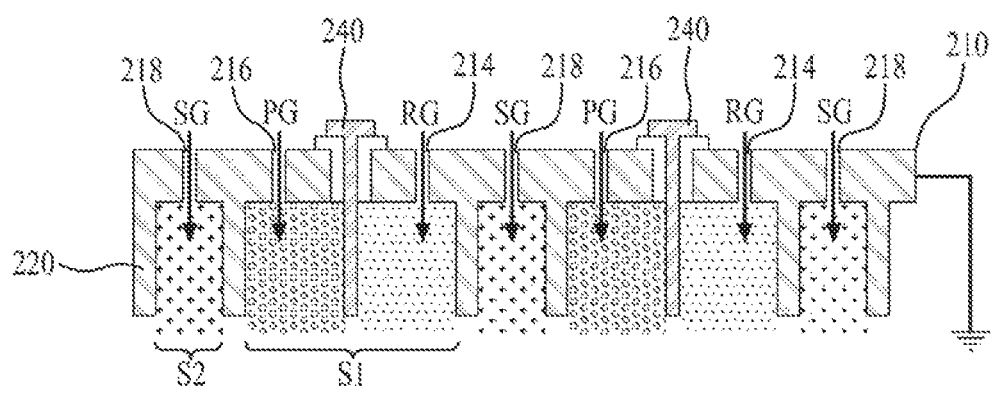
FIG. 8 is a cross sectional view showing some portions of an electrode unit shown in FIG. 7.

FIG. 7 illustrates a substrate processing apparatus according to the second embodiment of the present invention. FIG. 8 is a cross sectional view showing some portions of an electrode unit shown in FIG. 7.

Referring to FIGS. 7 and 8, the substrate processing apparatus 300 according to the second embodiment of the present invention may include a process chamber 110, a substrate support 120, an electrode unit 330, an electrode cover 140, a plasma power supplier 150, a reaction gas supplier 160, a source gas supplier 170, and a purge gas supplier 380. Except the electrode unit 330 and the purge gas supplier 380, the substrate processing apparatus 300 according to the second embodiment of the present invention is identical in structure to the substrate processing apparatus 100 according to the first embodiment of the present invention, whereby a detailed description for the same parts will be omitted.

The electrode unit 330 is formed to have a plurality of plasma forming spaces (S1) and a plurality of source gas distributing spaces (S2). The electrode unit 330 may include a ground frame 210, a plurality of space forming members 220, a plurality of insulating members 230, a plurality of plasma electrode members 240, a reaction gas supply member 350, a source gas supply member 260, and a purge gas supply member 370. Except the reaction gas supply member 350 and the purge gas supply member 370, the remaining structures of the electrode unit 330 are the same as those of the electrode unit 130 shown in FIGS. 3 and 4, whereby a detailed description for the same parts will be omitted.

The reaction gas supply member 350 supplies the aforementioned reaction gas (RG), which is supplied from the reaction gas supplier 160, to a plurality of first gas supply holes 214 formed in the ground frame 210, whereby the reaction gas (RG) is distributed to one side for each of the plasma forming spaces (S1) through the plurality of first gas supply holes 214 formed in the ground frame 210. To this end, the reaction gas supply member 350 may include a first main gas pipe 352, and a plurality of first branch gas pipes 354.

The first main gas pipe 352 penetrating through the electrode cover 140 is connected with the reaction gas supplier 160.

Each of the first branch gas pipes 354 is diverged from the first main gas pipe 352, and is then combined with the ground frame 210 while being communicated with the plurality of first gas supply holes 214 formed in the ground frame 210.

The purge gas supply member 370 supplies purge gas (PG), which is supplied from the purge gas supplier 380, to the plurality of second gas supply holes 216 formed in the ground frame 210, whereby the purge gas (PG) is distributed to the other side for each of the plasma forming spaces (S1) through the plurality of second gas supply holes 216 formed in the ground frame 210. To this end, the purge gas supply member 370 may include a third main gas pipe 372, and a plurality of third branch gas pipes 374.

The third main gas pipe 372 penetrating through the electrode cover 140 is connected with the purge gas supplier 380.

Each of the third branch gas pipes 374 is diverged from the third main gas pipe 372, and is then combined with the ground frame 210 while being communicated with the plurality of second gas supply holes 216 formed in the ground frame 210.

The purge gas supplier 380 may be provided in the electrode cover 140 or provided outside the process chamber 110. The purge gas supplier 380 supplies the predetermined purge gas (PG) to the purge gas supply member 370. In this case, the purge gas (PG) purges the source gas (SG) which is not deposited on the substrate (W), and/or the remaining reaction gas (RG) which does not react with the source gas (SG). The purge gas may be at least any one kind of gas among nitrogen (N2), argon (Ar), xenon (Ze) and helium (He).

Hereinafter, a substrate processing method using the substrate processing apparatus according to the second embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 330, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 330, and the reaction gas (RG) is supplied to one side for each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby the predetermined thin film material is deposited on the substrate (W).

After stopping the supply of plasma power to each of the plasma electrode members 240 prepared in the electrode unit 330, the purge gas (PG) is supplied to each of the plasma forming spaces (S1), whereby the purge gas (PG) is distributed to a lower side for each of the plasma forming spaces (S1). Thus, the purge gas (PG) is distributed onto the plurality of substrates (W) rotated in accordance with the rotation of the substrate support 120. The purge gas (PG) purges the source gas (SG) which is not deposited on the substrate (W), and/or the remaining reaction gas (RG) which does not react with the source gas (SG).

In the aforementioned substrate processing apparatus and method, the steps for distributing the source gas (SG), forming the plasma and distributing the purge gas (PG) may be carried out at the same time, or may be carried out in sequence. During the step for distributing the purge gas (PG), the plasma power together with the purge gas (PG) may be supplied to each plasma electrode member 240 so as to form the plasma for each of the plasma forming spaces (S1), whereby the purge gas of plasma state may be formed toward the substrate (W).

Figure 9:
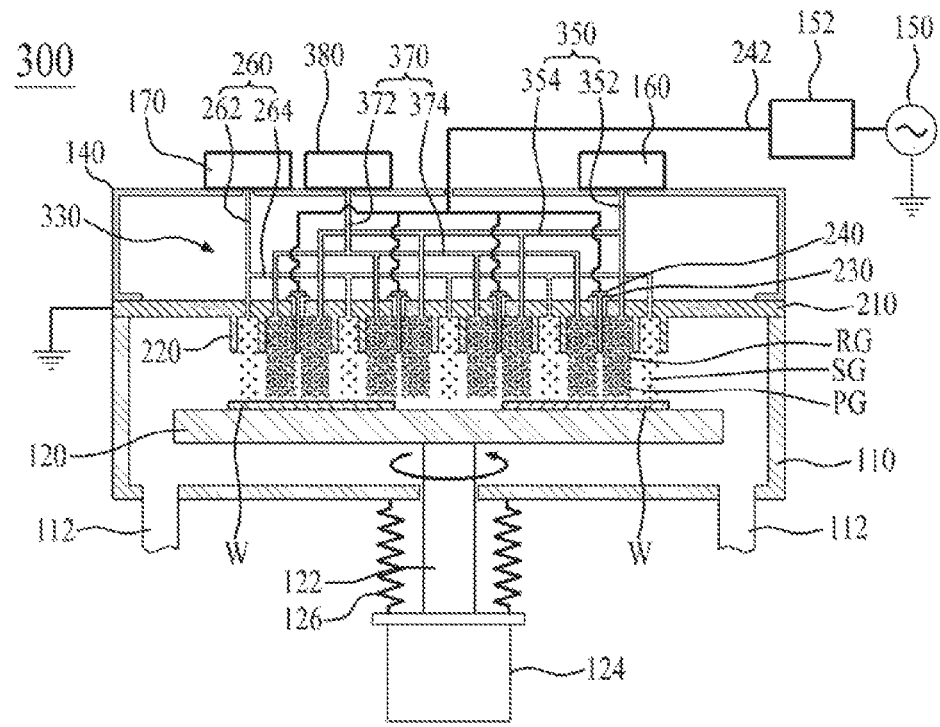
FIG. 9 illustrates a modified embodiment of the substrate processing apparatus according to the second embodiment of the present invention.
Figure 10:
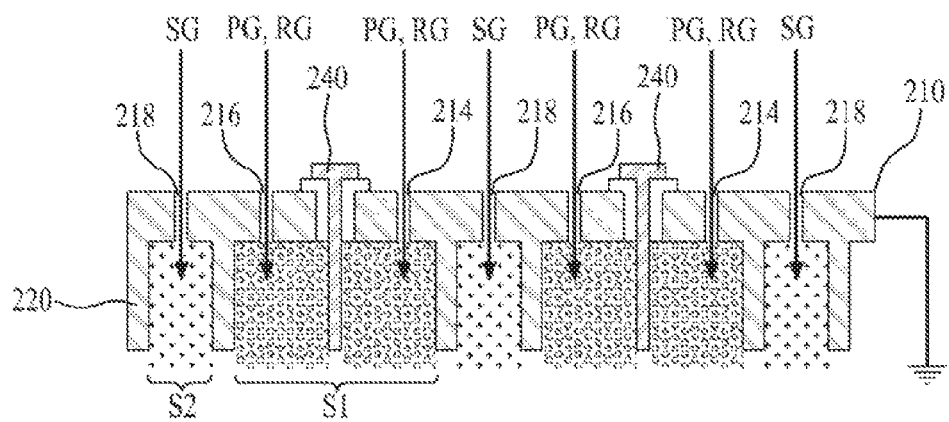
FIG. 10 is a cross sectional view showing some portions of an electrode unit shown in FIG. 9.

Meanwhile, in the aforementioned substrate processing apparatus and method, the purge gas (PG) and the reaction gas (RG) may be separately provided through the respective gas supply holes 214 and 216, and supplied to each of the plasma forming spaces (S1), but not necessarily. The purge gas (PG) and the reaction gas (RG) may be supplied through the same gas supply hole 214 and 216. To this end, as shown in FIGS. 9 and 10, the aforementioned reaction gas supply member 350 is communicated with some of the first gas supply holes 214, and also communicated with some of the second gas supply holes 216. The aforementioned purge gas supply member 370 is communicated with the remaining holes among the first gas supply holes 214, and also communicated with the remaining holes among the second gas supply holes 216. Accordingly, the purge gas (PG) together with the reaction gas (RG) may be supplied to the plurality of plasma forming spaces (S1) through the plurality of first gas supply holes 214 and the plurality of second gas supply holes 216. In another way, the aforementioned reaction gas supply member 350 and the aforementioned purge gas supply member 370 may be communicated with each other so that the purge gas (PG) and the reaction gas (RG) may be supplied to the plurality of plasma forming spaces (S1) through the plurality of first gas supply holes 214 and the plurality of second gas supply holes 216.

The above substrate processing apparatus and method according to the second embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 330 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

Figure 11:
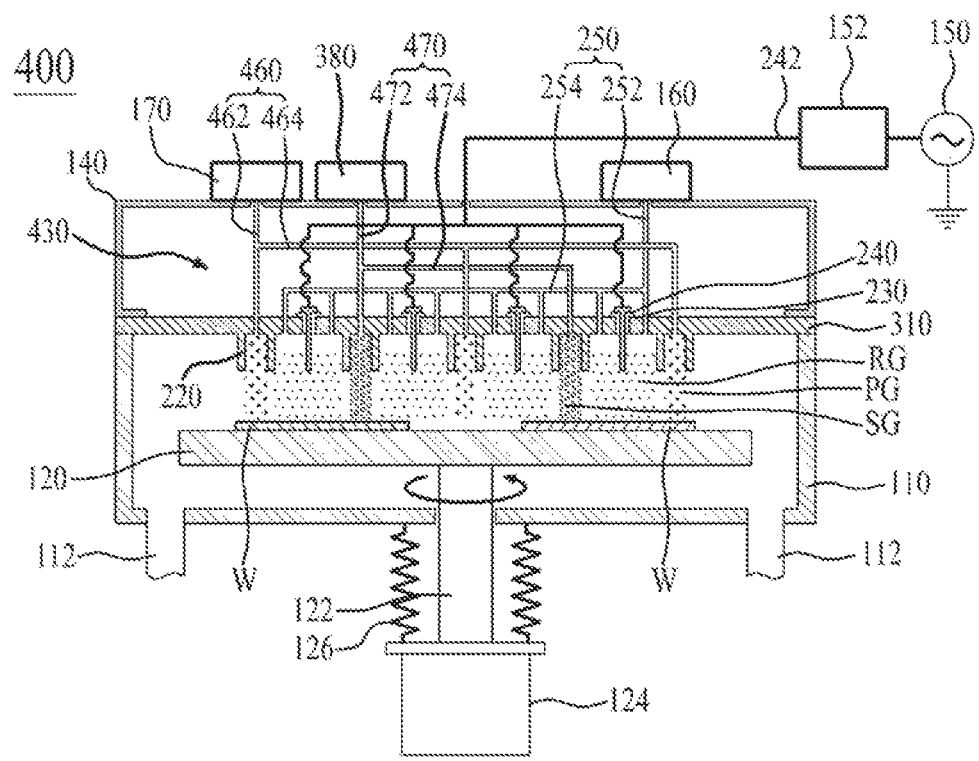
FIG. 11 illustrates a substrate processing apparatus according to the third embodiment of the present invention.
Figure 12:
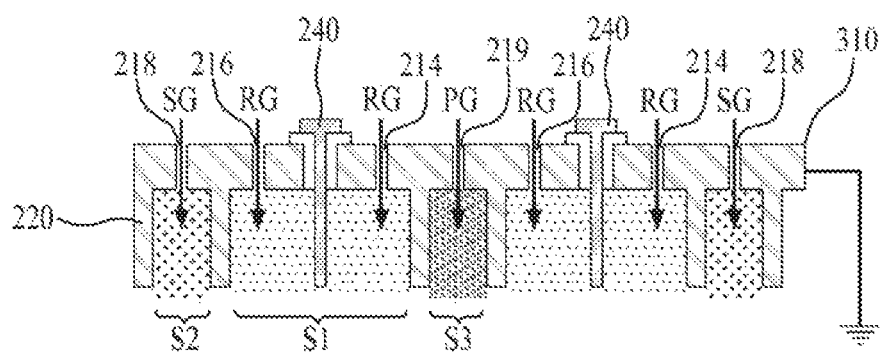
FIG. 12 is a cross sectional view showing some portions of an electrode unit shown in FIG. 11.

FIG. 11 illustrates a substrate processing apparatus according to the third embodiment of the present invention. FIG. 12 is a cross sectional view showing some portions of an electrode unit shown in FIG. 11.

Referring to FIGS. 11 and 12, the substrate processing apparatus 400 according to the third embodiment of the present invention may include a process chamber 110, a substrate support 120, an electrode unit 430, an electrode cover 140, a plasma power supplier 150, a reaction gas supplier 160, a source gas supplier 170, and a purge gas supplier 380. Except the electrode unit 430 and the purge gas supplier 380, the substrate processing apparatus 400 according to the third embodiment of the present invention is identical in structure to the substrate processing apparatus 100 according to the first embodiment of the present invention, whereby a detailed description for the same parts will be omitted.

The electrode unit 430 may include a plurality of plasma forming spaces (S1), a plurality of source gas distributing spaces (S2), and a purge gas distributing space (S3), wherein the purge gas distributing space (S3) may be prepared in between a pair of plasma forming spaces (S1) prepared in between a pair of neighboring source gas distributing spaces (S2). To this end, the electrode unit 430 may include a ground frame 310, a plurality of space forming members 220, a plurality of insulating members 230, a plurality of plasma electrode members 240, a reaction gas supply member 250, a source gas supply member 460, and a purge gas supply member 470. Except the ground frame 310, the source gas supply member 460 and the purge gas supply member 470, the remaining structures of the electrode unit 430 are the same as those of the electrode unit 130 shown in FIGS. 3 and 4, whereby a detailed description for the same parts will be omitted.

Except that the ground frame 310 includes a plurality of fourth gas supply holes 219 overlapping with the purge gas distributing space (S3), the ground frame 310 shown in FIGS. 11 and 12 is identical to the ground frame 210 shown in FIGS. 3 and 4, wherein a detailed description for the ground frame 310 will be omitted. That is, in case of the substrate processing apparatus 300 according to the second embodiment of the present invention, the source gas distributing space (S2) prepared in between a pair of plasma forming spaces (S1) prepared in between a pair of neighboring source gas distributing spaces (S2) in the ground frame 210 of FIGS. 3 and 4 may be used as the purge gas distributing space (S3), and the plurality of third gas supply holes 218 overlapping with the purge gas distributing space (S3) may be used as the fourth gas supply hole 219.

The source gas supply member 460 supplies source gas (SG), which is supplied from the source gas supplier 170, to the plurality of third gas supply holes 218 formed in the ground frame 310, whereby the source gas (SG) is distributed to each of the source gas distributing spaces (S2) through the plurality of third gas supply holes 218. To this end, the source gas supply member 460 may include a second main gas pipe 462, and a plurality of second branch gas pipes 464.

The second main gas pipe 462 penetrating through the electrode cover 140 is connected with the source gas supplier 170.

Each of the second branch gas pipes 464 is diverged from the second main gas pipe 462, and is then combined with the ground frame 310 while being communicated with the plurality of third gas supply holes 218 formed in the ground frame 310.

The purge gas supply member 470 supplies purge gas (PG), which is supplied from the purge gas supplier 380, to the plurality of fourth gas supply holes 219 formed in the ground frame 310, whereby the purge gas (PG) is distributed to each of the purge gas distributing spaces (S3) through the plurality of fourth gas supply holes 219. To this end, the purge gas supply member 470 may include a third main gas pipe 472, and a plurality of third branch gas pipes 474.

The third main gas pipe 472 penetrating through the electrode cover 140 is connected with the purge gas supplier 380.

Each of the third branch gas pipes 474 is diverged from the third main gas pipe 472, and is then combined with the ground frame 310 while being communicated with the plurality of fourth gas supply holes 219 formed in the ground frame 310.

The purge gas supplier 380 supplies the predetermined purge gas (PG) to each of the purge gas distributing spaces (S3) prepared in the electrode unit 430. To this end, the purge gas supplier 380 may be provided on an upper surface of the electrode cover 140 or outside the process chamber 110, and be communicated with the aforementioned purge gas supply member 470, whereby the purge gas (PG) may be provided to each of the purge gas distributing spaces (S3) of the electrode unit 430. In this case, the purge gas (PG) purges the source gas (SG) which is not deposited on the substrate (W), and/or the remaining reaction gas (RG) which does not react with the source gas (SG). The purge gas may be at least any one kind of gas among fluorinated carbons (CF4), nitrogen (N2), argon (Ar), xenon (Ze) and helium (He).

Hereinafter, a substrate processing method using the substrate processing apparatus according to the third embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 430, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 430, and the reaction gas (RG) is supplied to each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby a predetermined thin film material is deposited on the substrate (W).

Thereafter, the purge gas (PG) is supplied to each of the purge gas distributing spaces (S3) prepared in the electrode unit 430, whereby the purge gas (PG) is distributed to a lower side for each of the purge gas distributing spaces (S3). Accordingly, the purge gas (PG) is distributed onto the plurality of substrates (W) rotated in accordance with the rotation of the substrate support 120. The purge gas (PG)

purges the source gas (SG) which is not deposited on the substrate (W), and/or the remaining reaction gas (RG) which does not react with the source gas (SG).

In the above substrate processing apparatus and method, the steps for distributing the source gas (SG), forming the plasma and distributing the purge gas (PG) may be carried out at the same time, or may be carried out in sequence.

The above substrate processing apparatus and method according to the third embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 430 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

Figure 13:
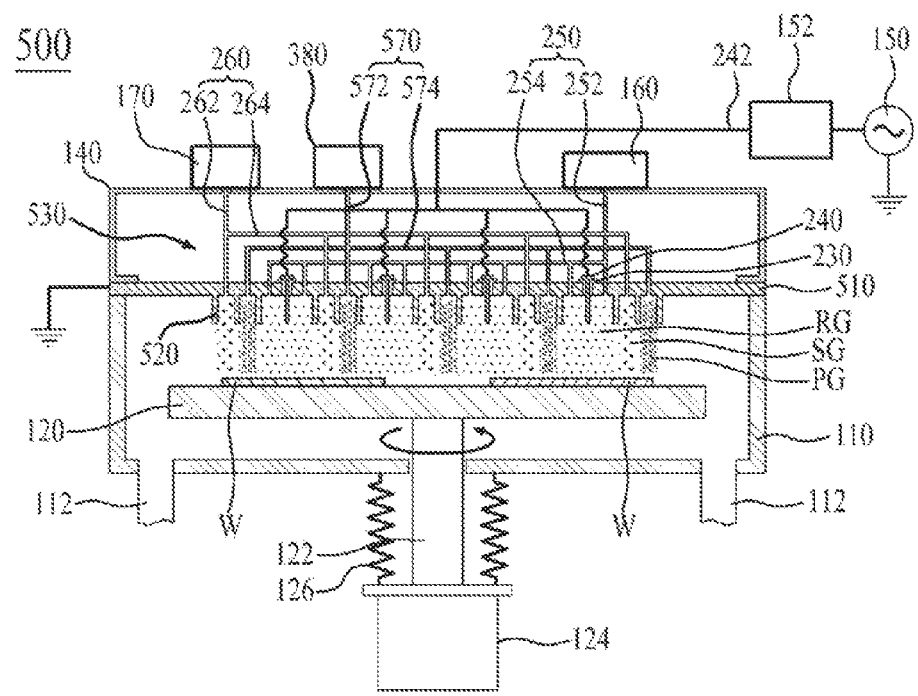
FIG. 13 illustrates a substrate processing apparatus according to the fourth embodiment of the present invention.
Figure 14:
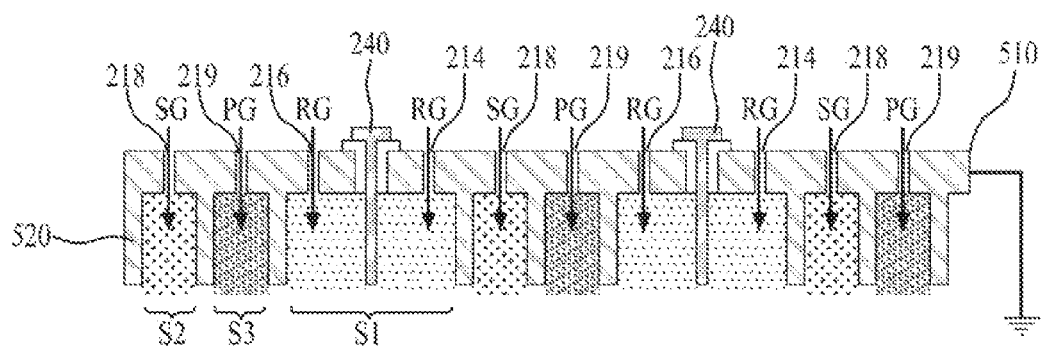
FIG. 14 is a cross sectional view showing some portions of an electrode unit shown in FIG. 13.

FIG. 13 illustrates a substrate processing apparatus according to the fourth embodiment of the present invention. FIG. 14 is a cross sectional view showing some portions of an electrode unit shown in FIG. 13.

Referring to FIGS. 13 and 14, the substrate processing apparatus 500 according to the fourth embodiment of the present invention may include a process chamber 110, a substrate support 120, an electrode unit 530, an electrode cover 140, a plasma power supplier 150, a reaction gas supplier 160, a source gas supplier 170, and a purge gas supplier 380. Except the electrode unit 530 and the purge gas supplier 380, the substrate processing apparatus 500 according to the fourth embodiment of the present invention is identical in structure to the substrate processing apparatus 100 according to the first embodiment of the present invention, whereby a detailed description for the same parts will be omitted.

The electrode unit 530 may include a plurality of plasma forming spaces (S1), a plurality of source gas distributing spaces (S2), and a plurality of purge gas distributing spaces (S3) prepared between the plasma forming space (S1) and the source gas distributing space (S2). To this end, the electrode unit 530 may include a ground frame 510, a plurality of space forming members 520, a plurality of insulating members 230, a plurality of plasma electrode members 240, a reaction gas supply member 250, a source gas supply member 260, and a purge gas supply member 570. Except the ground frame 510, the plurality of space forming members 520 and the purge gas supply member 570, the remaining structures of the electrode unit 530 are the same as those of the electrode unit 130 shown in FIGS. 3 and 4, whereby a detailed description for the same parts will be omitted.

Except that the ground frame 510 includes a plurality of fourth gas supply holes 219 which are formed between second and third gas supply holes 216 and 218 while being overlapped with the plurality of purge gas distributing spaces (S3), the ground frame 510 shown in FIGS. 13 and 14 is identical to the ground frame 210 shown in FIGS. 3 and 4, whereby a detailed description for the ground frame 510 will be omitted.

Except that each of the space forming members 520 protrudes with a predetermined height from a lower surface of the ground frame 510 so as to form the plurality of plasma forming spaces (S1), the plurality of source gas distributing spaces (S2) and the plurality of purge gas distributing spaces (S3), the plurality of space forming members 520 are identical to the plurality of space forming members 220 shown in FIGS. 3 and 4, wherein a detailed description for the same parts will be omitted.

The purge gas supply member 570 supplies the purge gas (PG), which is supplied from the purge gas supplier 380, to the plurality of fourth gas supply holes 219 formed in the ground frame 510, whereby the purge gas (PG) is distributed to the plurality of purge gas distributing spaces (S3) through the plurality of fourth gas supply holes 219. To this end, the purge gas supply member 570 may include a third main gas pipe 572, and a plurality of third branch gas pipes 574.

The third main gas pipe 572 penetrating through the electrode cover 140 is connected with the purge gas supplier 380.

Each of the third branch gas pipes 574 is diverged from the third main gas pipe 572, and is then combined with the ground frame 510 while being communicated with the plurality of fourth gas supply holes 219 formed in the ground frame 510.

The purge gas supplier 380 supplies the predetermined purge gas (PG) to each of the purge gas distributing spaces (S3) prepared in the electrode unit 530. To this end, the purge gas supplier 380 may be provided on an upper surface of the electrode cover 140 or outside the process chamber 110, and be communicated with the aforementioned purge gas supply member 570, whereby the purge gas (PG) may be provided to each of the purge gas distributing spaces (S3) of the electrode unit 530. In this case, the purge gas (PG) purges the source gas (SG) which is not deposited on the substrate (W), and/or the remaining reaction gas (RG) which does not react with the source gas (SG). The purge gas may be at least any one kind of gas among fluorinated carbons (CF4), nitrogen (N2), argon (Ar), xenon (Ze) and helium (He).

Hereinafter, a substrate processing method using the substrate processing apparatus according to the fourth embodiment of the present invention will be described as follows.

First, the plurality of substrates (W) are loaded and placed at fixed intervals onto the substrate support 120.

Then, the substrate support 120 onto which the plurality of substrates (W) are loaded and placed is rotated to a predetermined direction.

Thereafter, the source gas (SG) is supplied to each of the source gas distributing spaces (S2) prepared in the electrode unit 530, and is then distributed toward a lower side for each of the source gas distributing spaces (S2), whereby the source gas (SG) is distributed onto the plurality of substrates (W) rotated in accordance with the rotation of the substrate support 120.

Then, plasma power is supplied to each of the plasma electrode members 240 prepared in the electrode unit 530, and the reaction gas (RG) is supplied to each of the plasma forming spaces (S1) so as to form the plasma for each of the plasma forming spaces (S1), whereby the reaction gas of the plasma state in the plasma forming space (S1) is formed toward the substrate (W). Accordingly, the source gas (SG) distributed from each source gas distributing space (S2) and the reaction gas of the plasma state formed from the plasma forming space (S1) reacts to each other on the plurality of substrates (W) rotated in accordance with the rotation of the substrate support 120, whereby a predetermined thin film material is deposited on the substrate (W).

Thereafter, the purge gas (PG) is supplied to each of the purge gas distributing spaces (S3) prepared in the electrode unit 530, whereby the purge gas (PG) is distributed to a lower side for each of the purge gas distributing spaces (S3). Thus, the purge gas (PG) is distributed onto the plurality of substrates (W) rotated in accordance with the rotation of the substrate support 120. The purge gas (PG) purges the source gas (SG) which is not deposited on the substrate (W), and/or the remaining reaction gas (RG) which does not react with the source gas (SG).

In the above substrate processing apparatus and method, the steps for distributing the source gas (SG), forming the plasma and distributing the purge gas (PG) may be carried out at the same time, or may be carried out in sequence.

The above substrate processing apparatus and method according to the fourth embodiment of the present invention improves step coverage of the thin film material, facilitates to control quality of the thin film and improves use efficiency of the source gas (SG) and uniformity of the thin film material by spatially separating the plasma forming space (S1) and the source gas distributing space (S2) prepared in the electrode unit 530 arranged above an entire upper side of the substrate support 120 for rotating the plurality of substrates (W), and furthermore facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

In the above substrate processing apparatuses and methods according to the first to fourth embodiments of the present invention, one kind of source gas (SG) is supplied to the plurality of source gas distributing spaces (S2), but not necessarily. For example, various kinds of source gas may be supplied to the respective source gas distributing spaces (S2). In this case, a multi-layered thin film including several layers formed of various thin film materials may be formed on the substrate (W).

Accordingly, the substrate processing apparatus and method according to the present invention improves step coverage of the thin film material and facilitates to control quality of the thin film by spatially separating the plasma forming space (S1) and the source gas distributing space (S2) from each other, and also improves use efficiency of the source gas (SG) and uniformity of the thin film material by preventing the thin film material from being deposited in the surroundings of plasma forming space (S1) and/or plasma electrode member or minimizing the deposition of thin film material in the surroundings of plasma forming space (S1) and/or plasma electrode member. Furthermore, the substrate processing apparatus and method according to the present invention facilitates to control quality of the thin film and improves uniformity of the thin film material by purging the source gas (SG) which is not deposited on the substrate (W), and/or the remaining reaction gas (RG) which does not react with the source gas (SG) through the use of purge gas (PG).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
    a process chamber;
    a substrate support inside the process chamber, configured to support a substrate; and
    an electrode unit above the substrate support, wherein the electrode unit includes:
        a plurality of electrically grounded space forming members that protrude toward the substrate support so as to prepare a plurality of plasma forming spaces and a plurality of source gas distributing spaces which are spatially separated from each other;
        a ground frame comprising a plurality of insertion holes, a plurality of first gas supply holes configured to distribute a first gas, a plurality of second gas supply holes configured to distribute a second gas, the second gas being different from the first gas, and a plurality of third gas supply holes configured to distribute a third gas different from the first gas and second gas;
        the first, second and third gas supply holes are each associated with a respective plurality of first, second and third gas distributing spaces; and
        a plurality of plasma electrode members, wherein each of the plurality of plasma electrode members protrudes through the insertion hole and is in a central portion of a corresponding one of the plurality of plasma forming spaces configured to receive the first and second gas in the first and second gas distributing spaces on opposite sides of the electrode member, the plurality of plasma forming spaces are spatially separated from each other, and each of the plurality of plasma forming spaces is spatially separated from each of the plurality of third gas distributing spaces.

2. The substrate processing apparatus according to claim 1, wherein each of the plurality of plasma forming spaces is between each of the third gas distributing spaces.

3. The substrate processing apparatus according to claim 1, further comprising:
    a plasma power supplier configured to supply plasma power to each of the plurality of plasma electrode members;
    a first gas supplier configured to supply the first gas to each of the plurality of plasma forming spaces; and
    a third gas supplier configured to supply the third gas to each of the plurality of third gas distributing spaces.

4. The substrate processing apparatus according to claim 3, wherein the first gas in each of the plurality of plasma forming spaces enters a plasma state in each of the plurality of plasma forming spaces, and the first gas in the plasma state is distributed onto the substrate.

5. A substrate processing apparatus comprising:
    a process chamber;
    a substrate support inside the process chamber, configured to support a plurality of substrates; and
    an electrode unit above the substrate support, wherein the electrode unit includes:
        a plurality of plasma forming spaces spatially separated from each other;
        a plurality of third gas distributing spaces spatially separated from each of the plurality of plasma forming spaces;
        a ground frame comprising a plurality of insertion holes, a plurality of first gas supply holes configured to distribute a first gas, a plurality of second gas supply holes configured to distribute a second gas, the second gas being different from the first gas, and a plurality of third gas supply holes configured to distribute a third gas different from the first gas and second gas;

the first, second and third gas supply holes are each associated with a respective plurality of first, second and third gas distributing spaces; and a plurality of plasma electrode members, wherein each of the plurality of plasma electrode members protrudes through the insertion hole and is in a central portion of a corresponding one of the plurality of plasma forming spaces configured to receive the first and second gas in the first and second gas distributing spaces on opposite sides of the electrode member, and the plurality of third gas distributing spaces configured to receive the third gas are spatially separated from each other.

6. The substrate processing apparatus according to claim 5, further comprising:

a plasma power supplier configured to supply plasma power to each of the plurality of plasma electrode members;

a first gas supplier configured to supply the first gas to each of the plurality of plasma forming spaces; and a third gas supplier configured to supply the third gas to each of the plurality of third gas distributing spaces.

7. The substrate processing apparatus according to claim 6, wherein the first gas in each of the plurality of plasma forming spaces enters a plasma state in each of the plurality of plasma forming spaces, and the first gas in the plasma state is distributed onto the substrate.

8. The substrate processing apparatus according to claim 1, further comprising:

The ground frame having a plurality of insertion holes therein, and a plurality of insulating members, each in a corresponding one of the insertion holes and having an opening, wherein each of the plurality of plasma electrode members is in the opening of a corresponding one of the plurality of insulating members, and each of the plurality of insulating members electrically insulates the ground frame from the corresponding plasma electrode member.

9. The substrate processing apparatus according to claim 8, wherein each of the insulating members has a T-shaped cross section and includes a body in the corresponding insertion hole, and a head on an upper surface of the body and supported by an upper surface of the ground frame.

10. The substrate processing apparatus according to claim 8, wherein each of the plurality of plasma electrode members protrudes at a predetermined height out of the ground frame.

11. The substrate processing apparatus according to claim 10, wherein each of the plurality of plasma electrode members protrudes from the ground frame at a same height as each of the plurality of space forming members.

12. The substrate processing apparatus according to claim 5, further comprising:

The ground frame having a plurality of insertion holes therein, and a plurality of insulating members, each in a corresponding one of the insertion holes and having an opening, wherein each of the plurality of plasma electrode members is in the opening of a corresponding one of the plurality of insulating members, and each of the plurality of insulating members electrically insulates the ground frame from the corresponding plasma electrode member.

13. The substrate processing apparatus according to claim 12, wherein each of the insulating members has a T-shaped cross section and includes a body in the corresponding insertion hole, and a head on an upper surface of the body and supported by an upper surface of the ground frame.

14. The substrate processing apparatus according to claim 12, wherein each of the plurality of plasma electrode members protrudes at a predetermined height out of the ground frame.

15. The substrate processing apparatus according to claim 14, wherein each of the plurality of plasma electrode members protrudes from the ground frame at a same height as each of the plurality of space forming members.

16. The substrate processing apparatus according to claim 12, wherein each of the plurality of plasma electrode members has a T-shaped cross section.

* * * * *